United States Patent
Subramanian et al.

(10) Patent No.: US 11,005,468 B1
(45) Date of Patent: May 11, 2021

(54) DUTY-CYCLE CORRECTION CIRCUIT FOR DDR DEVICES

(71) Applicant: Faraday Technology Corp., Hsin-Chu (TW)

(72) Inventors: Sivaramakrishnan Subramanian, Karnataka (IN); Sridhar Cheruku, Karnataka (IN); Sandeep Kumar Mohanta, Karnataka (IN); Hussainvali Shaik, Karnataka (IN)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 17/016,333

(22) Filed: Sep. 9, 2020

(51) Int. Cl.
*H03K 5/156* (2006.01)
*H03L 7/081* (2006.01)

(52) U.S. Cl.
CPC ......... *H03K 5/1565* (2013.01); *H03L 7/0814* (2013.01); *H03L 7/0818* (2013.01)

(58) Field of Classification Search
None
See application file for complete search history.

(56) References Cited

U.S. PATENT DOCUMENTS

| | | | | |
|---|---|---|---|---|
| 2007/0080731 A1* | 4/2007 | Kim | ..................... | H03K 5/1565 327/175 |
| 2012/0169391 A1* | 7/2012 | Sofer | ................... | H03K 5/1565 327/174 |
| 2019/0181847 A1* | 6/2019 | Satoh | .................... | H03L 7/0812 |

* cited by examiner

*Primary Examiner* — Cassandra F Cox
(74) *Attorney, Agent, or Firm* — Winston Hsu (57) ABSTRACT

A method for performing duty-cycle correction of an output clock in a Double Data Rate (DDR) system includes: setting a fixed delay of a rising-edge of the output clock as a parameter X which is equal to a digital Master Delay Locked Loop (MDLL) code of the DDR system multiplied by a percentage representing an estimated distortion of the duty-cycle of the output clock from a desired duty-cycle; shifting the rising-edge of the output clock by the fixed delay; and determining whether a duty cycle of the shifted output clock meets the desired duty-cycle. When a duty-cycle of the shifted output clock meets the desired duty-cycle, the fixed rising-edge delay is taken as a final delay code for the output clock; otherwise, a falling-edge of the output clock is shifted by an amount in a range between 0 and NX, wherein N is an integer.

9 Claims, 9 Drawing Sheets

I/P duty-cycle is <50%

FIG. 1A RELATED ART

I/P duty-cycle is >50%

FIG. 1B RELATED ART

I/P duty-cycle is =58% @ Slow PVT

Can correct to 50%

I/P duty-cycle is =58% @ Fast PVT

Can only correct to 53%

DUTY-CYCLE CORRECTION CIRCUIT FOR DDR DEVICES

BACKGROUND OF THE INVENTION

1. Field of the Invention

The invention is related to duty-cycle correction, and more particularly, to duty-cycle correction which can correct an output duty-cycle to 50% and is constant for all process, voltage and temperature variations.

2. Description of the Prior Art

A common aim of duty-cycle correction is to achieve a duty-cycle of 50%, i.e. the portion of a time period for which a signal is positive is the same as the portion of the time period for which the signal is negative. This allows the signal to be used in differential applications.

The related art provides two solutions for duty-cycle correction. In a first solution, when the duty-cycle of a square wave signal is initially less than 50%, the falling edge of the signal can be shifted so that the positive portion of the duty-cycle is extended. When the duty-cycle of a square wave signal is initially greater than 50%, the rising edge of the signal can be shifted so that the positive portion of the duty-cycle is shortened. Practically, this can be achieved by adding delay stages to a circuit which generates the signal, wherein a number of delay stages corresponds to a degree by which the rising edge or falling edge is shifted.

When there are multiple clocks, however, as each clock signal may require shifting by a different amount, the resultant clock signals will not be edge aligned at the rising edges; therefore, timing correlation amongst the clocks is missed after the duty-cycle correction has been carried out.

Figure 1A:
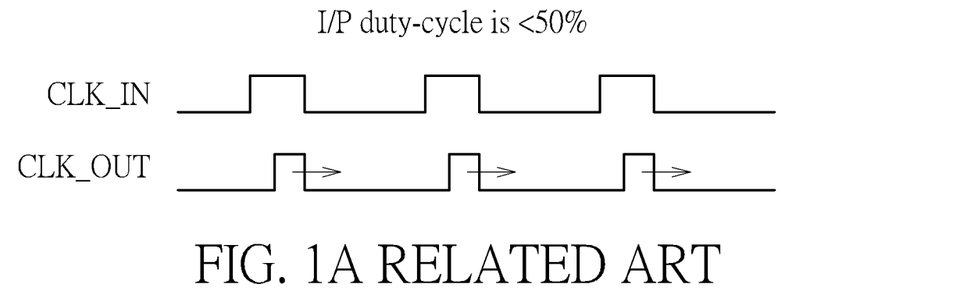
FIG. 1A is a diagram illustrating a duty-cycle less than 50% according to the related art.
Figure 1B:
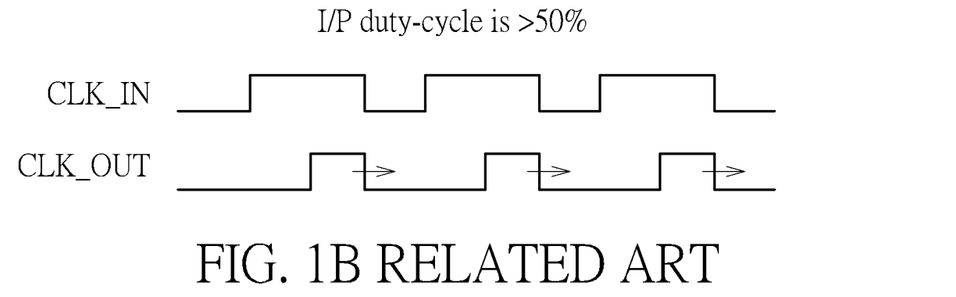
FIG. 1B is a diagram illustrating a duty-cycle more than 50% according to the related art.

A second solution therefore shifts the rising edge of each clock signal by a fixed amount to maintain the edge alignment. Then, the falling edge of each clock signal is shifted individually to achieve a duty-cycle of 50%. This is shown in FIG. 1A and FIG. 1B which, respectively, illustrate duty-cycle correction for an I/P duty-cycle less than 50% and an I/P duty cycle greater than 50%.

Figure 1C:
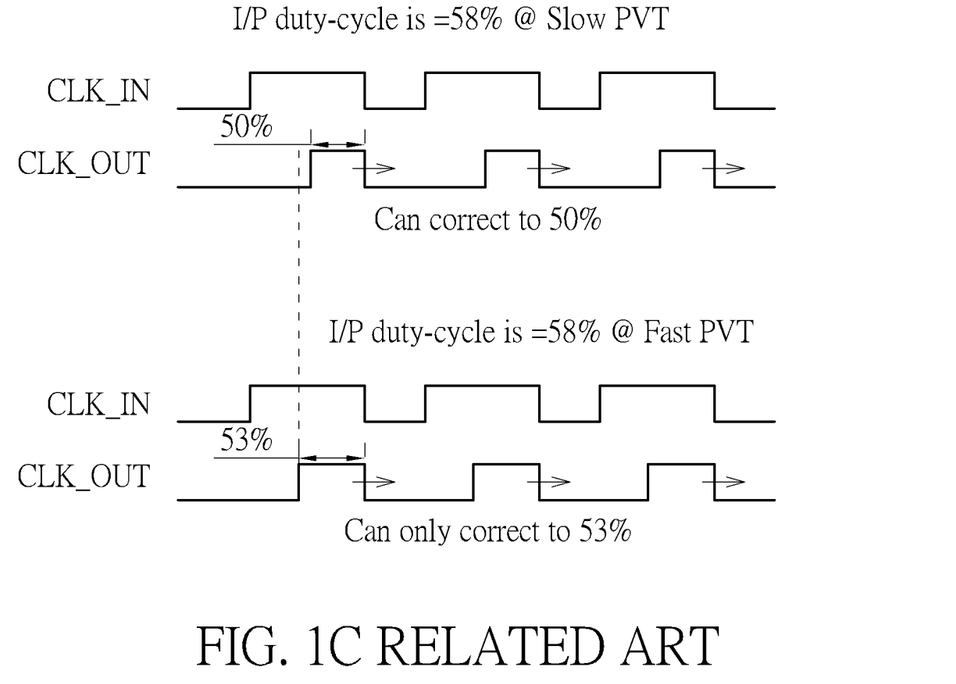
FIG. 1C is a diagram illustrating duty-cycles of slow PVT and fast PVT according to the related art.

Process, voltage and temperature (PVT) variations will determine the fixed amount by which the rising edge is shifted, wherein PVT variations may be small or large. Circuits therefore require a number of delay stages corresponding to the largest possible PVT. Having more delay stages increases the likelihood of adding jitter to the signal, and also makes it less likely that a 50% duty-cycle can be achieved. As illustrated in FIG. 1C, which shows duty-cycle correction for slow PVT and for fast PVT, the duty-cycle for the slow PVT can be corrected to 50%, but the duty-cycle for the fast PVT can only be corrected to 53%.

With this in mind, the need for an improved method for performing duty-cycle correction becomes clear.

SUMMARY OF THE INVENTION

It is therefore an objective of the present invention to provide a circuit and method for duty-cycle correction, particularly in a DDR system.

A method for performing duty-cycle correction of an output clock in a Double Data Rate (DDR) system comprises: setting a fixed delay of a rising-edge of the output clock as a parameter X which is equal to a digital Master Delay Locked Loop (MDLL) code of the DDR system multiplied by a percentage representing an estimated distortion of the duty-cycle of the output clock from a desired duty-cycle; shifting the rising-edge of the output clock by the fixed delay; and determining whether a duty cycle of the shifted output clock meets the desired duty-cycle. When a duty-cycle of the shifted output clock meets the desired duty-cycle, the fixed rising-edge delay is taken as a final delay code for the output clock; otherwise, a falling-edge of the output clock is shifted by an amount in a range between 0 and NX, wherein N is an integer.

A duty-cycle correction system for an output clock in a Double Data Rate (DDR) system is also disclosed. The duty-cycle correction system comprises: a duty-cycle correction circuit, for receiving an input clock and generating an output clock having a rising-edge shifted by a fixed delay X which is equal to a Master Delay Locked Loop (MDLL) code of the DDR system multiplied by a percentage representing an estimated distortion of the duty-cycle of the output clock from a desired duty-cycle; and a detector coupled to the duty-cycle correction circuit for comparing the shifted output clock with a reference voltage to generate a comparison signal. When the comparison signal indicates a duty-cycle of the shifted output clock meets the desired duty-cycle, the fixed rising-edge delay is taken as a final delay code for the output clock, and when the comparison signal indicates a duty-cycle of the shifted output clock does not meet the desired duty-cycle, the duty-cycle correction circuit shifts a falling-edge of the input clock by an amount in a range between zero and NX, wherein N is an integer.

These and other objectives of the present invention will no doubt become obvious to those of ordinary skill in the art after reading the following detailed description of the preferred embodiment that is illustrated in the various figures and drawings.

DETAILED DESCRIPTION

The method and circuit of the present invention aims to improve upon the duty-cycle correction method of the related art.

The present invention takes as its basis the second solution detailed in the background section, where a fixed delay is added to the rising edge of a signal, and the falling edge is shifted by a variable amount. As detailed in the background, the rising edge delay occurs due to PVT variations. The present invention therefore employs a method which can track the rising edge delay with the PVT, and thereby generate a fixed rising edge delay which is constant for a particular chip or wafer (which will have constant PVT) but can be varied for a different chip or wafer with different PVT.

This is achieved by using a Master Delay Locked Loop (MDLL) code. As is well-known in the art, the MDLL can track changes in PVT to provide a PVT compensated code. The MDLL will calibrate to one clock cycle under any PVT conditions. Once the MDLL code (defined as 'm') is known, a percentage of the decimal code can be taken to shift the rising delay. The percentage amount is initially determined by guessing the approximate duty-cycle of the output clock across wafers and the amount of variation compared to the desired 50%. The rising-edge delay is fixed to said variation as a percentage of the MDLL code. For example, assume the aim is to achieve 10% duty-cycle correction in a particular wafer. The MDLL code m for that wafer will correspond to 100% of the time period. The MDLL code is then multiplied by 10% to give the rising-edge delay. This resultant code achieves a 10% rising edge delay by turning on delay stages corresponding to 10% of the time period. Because the MDLL code will track PVT, the rising-edge delay will adapt to PVT also.

Figure 2:
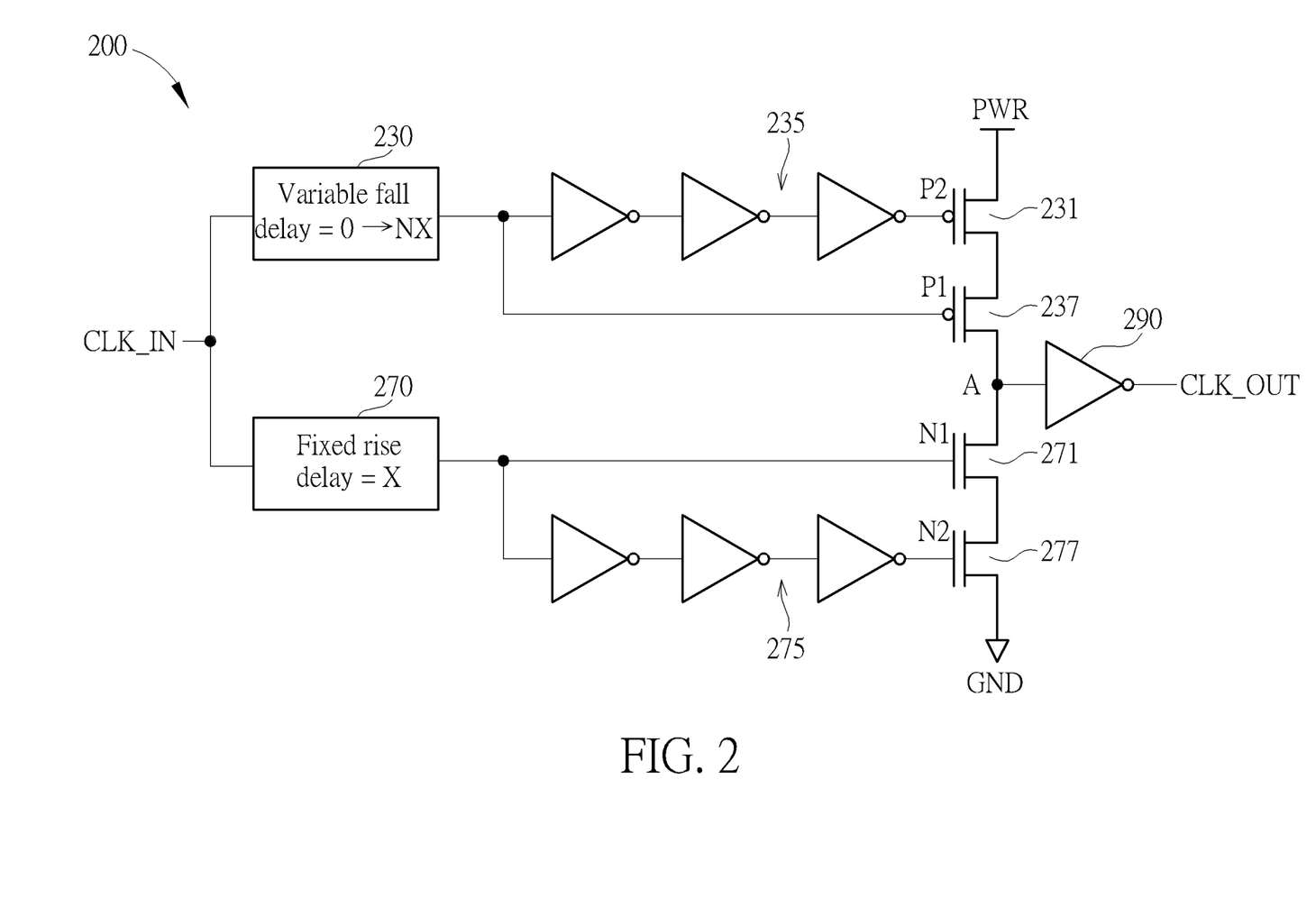
FIG. 2 is a diagram of a duty-cycle correction circuit according to an exemplary embodiment of the present invention.
Figure 4:
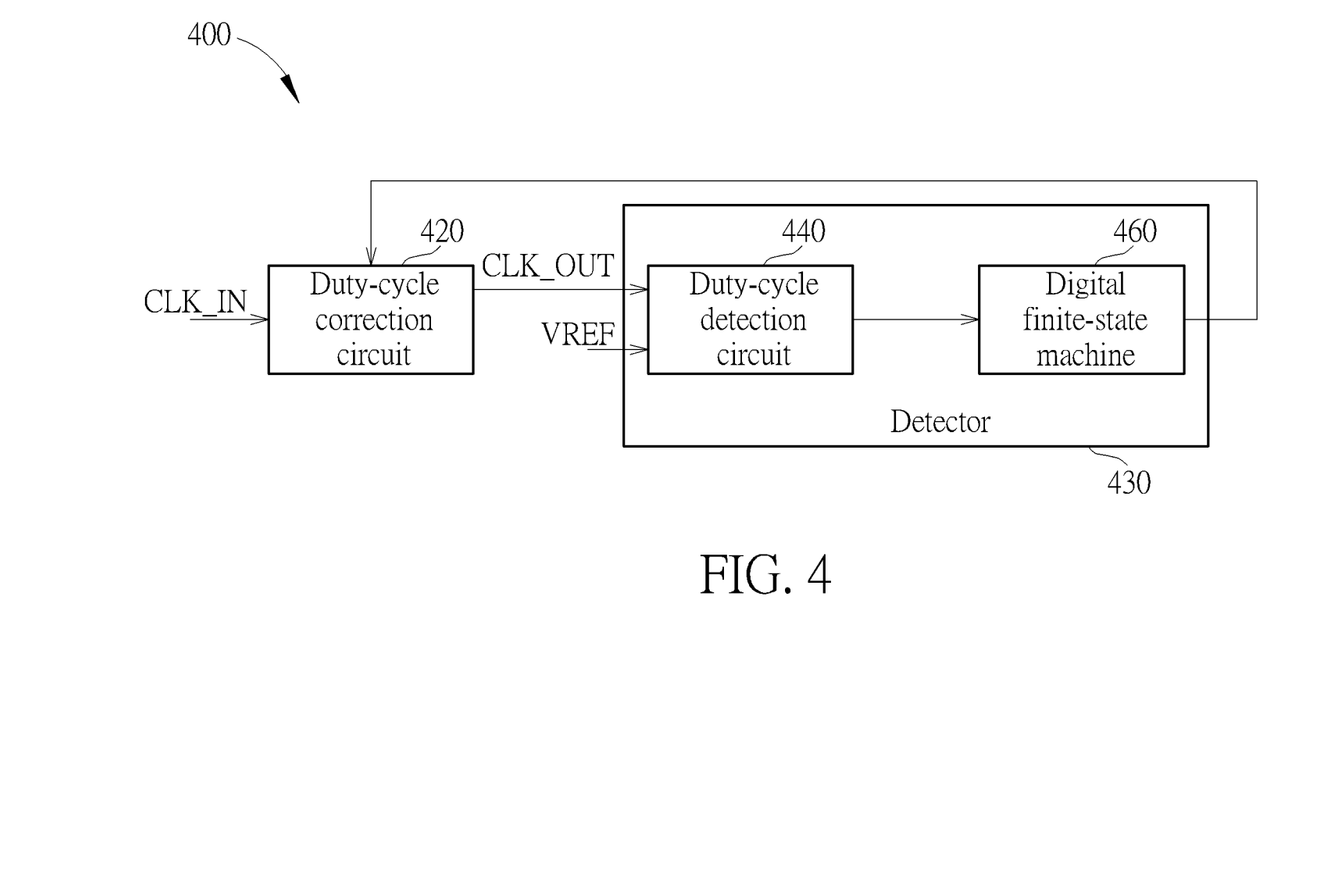
FIG. 4 is a diagram of a duty-cycle correction system according to an exemplary embodiment of the present invention.
Figure 5:
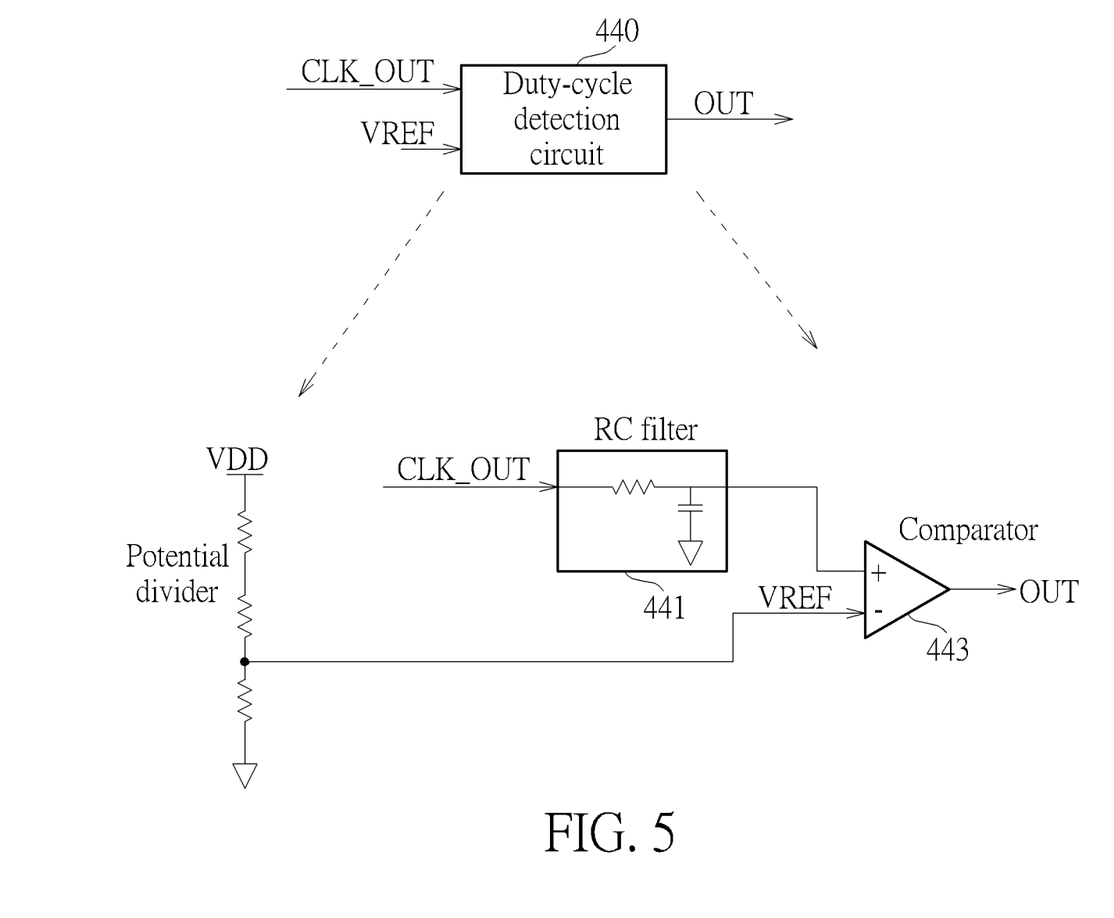
FIG. 5 is a diagram of a duty-cycle detection circuit illustrated in FIG. 4.

In some cases, shifting only the rising-edge by the fixed amount may reach a desired duty-cycle of 50%. In other cases, the falling-edge must also be shifted. The present invention uses a variable delay which is based on the rising edge delay X. The invention also provides a 'sweep' stage, which uses a comparator to determine when 50% duty-cycle has been reached. This stage is illustrated in FIGS. 4 and 5, and will be described later. The circuitry for achieving the rising-edge delay and the falling-edge delay is illustrated in FIG. 2. FIG. 2 shows a duty cycle correction circuit 200 according to an embodiment of the present invention. The duty cycle correction circuit 200 includes a variable fall delay circuit 230 for providing a variable delay in the range between 0 and NX to the falling edge of an input clock CLK_IN, wherein N is an integer and preferably equal to 2, and a fixed rise delay circuit 270 for providing a fixed delay of X to the rising edge of input clock CLK_IN, wherein X is a percentage of the decimal MDLL code 'm'. The duty cycle correction circuit 200 provides a first path P1 for the delayed falling edge which is input directly to PMOS 237, and a second path P2 which is input to PMOS 231 after passing through three series-coupled inverters 235. Similarly, the duty cycle correction circuit 200 provides a first path N1 for the delayed rising edge which is input directly to NMOS 271, and a second path N2 which is input to NMOS 277 after passing through three series-coupled inverters 275. MOSFETs 231, 237, 271, 277 are coupled in cascode between a power supply PWR and ground GND. Node A between PMOS 237 and NMOS 271 is coupled to an inverter 290, which generates an output clock CLK_OUT.

Figure 8:
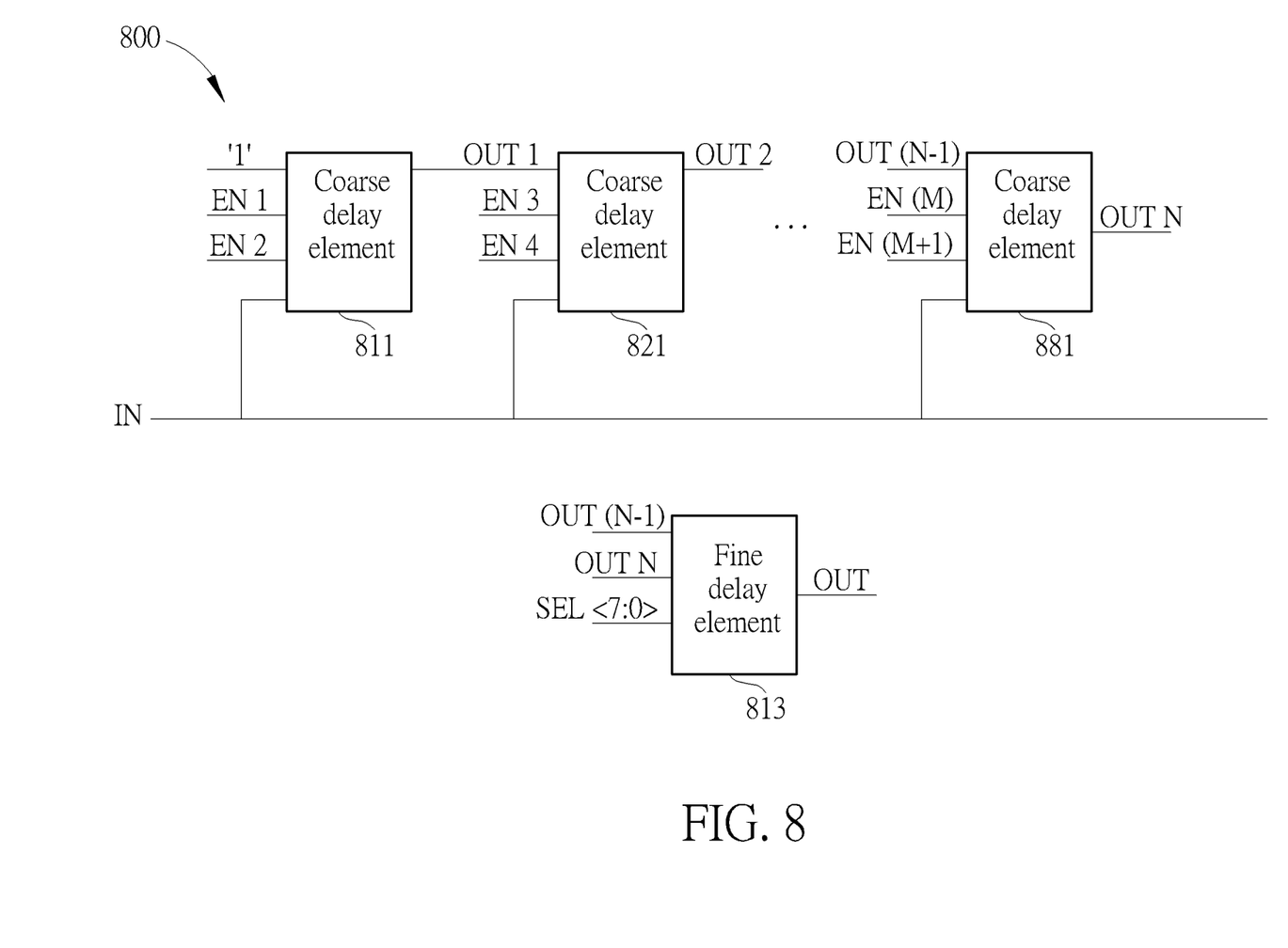
FIG. 8 is a diagram of coarse delay elements and fine delay elements within the duty-cycle correction circuit of FIG. 2.

As detailed above, the rising-edge of the input clock CLK_IN is shifted by a fixed amount determined as a percentage of the MDLL code. This delay amount is called 'X'. The fixed rise delay circuit 270 comprises a number of coarse delay elements and fine delay elements which are illustrated in FIG. 8. X will determine how many of these delay elements will be turned on. Similarly, the variable fall delay circuit 230 also comprises a number of coarse delay elements and fine delay elements, as illustrated in FIG. 8. X is used to calibrate the falling-edge delay, wherein the falling-edge delay can be varied by an amount in a range from 0~NX, where N is an integer, and preferably equal to 2. Broadly speaking, if X is equivalent to the delay provided by one coarse delay element, and the calibration determines that the falling-edge delay should be 2X, then one coarse delay element will be turned on in the fixed rise delay circuit 270, and two coarse delay elements will be turned on in the variable fall delay circuit 230. If the calibration determines that the falling-edge delay should be X, then one coarse delay element will be turned on in the fixed rise delay circuit 270, and one coarse delay element will be turned on in the variable fall delay circuit 230. If the calibration determines that the falling-edge delay should be 0, then one coarse delay element will be turned on in the fixed rise delay circuit 270, and no coarse delay elements will be turned on in the variable fall delay circuit 230. If the calibration determines that the falling-edge delay should be a value which is a fraction of X, then one coarse delay element will be turned on in the fixed rise delay circuit 270, and a combination of coarse and fine delay elements will be turned on in the variable fall delay circuit 230.

Figure 3:
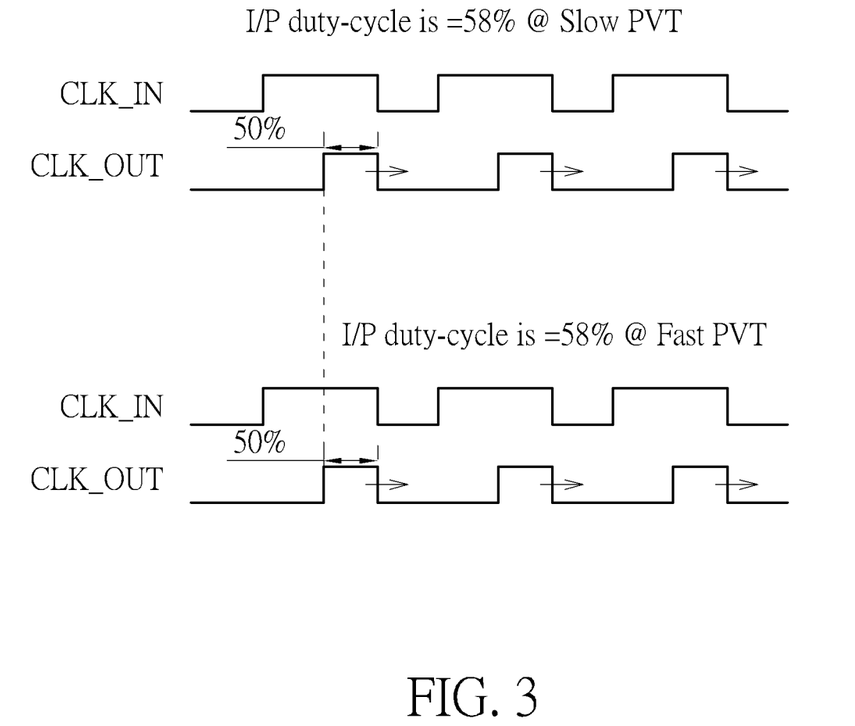
FIG. 3 is a diagram illustrating duty-cycles of slow PVT and fast PVT according to an exemplary embodiment of the present invention.

As shown in FIG. 3, regardless of whether the PVT is slow or fast, the rising-edge of both clock signals will be shifted by a same fixed amount as X is determined according to the MDLL code, so the duty-cycle correction range is the same across PVT. The falling edge of both output clocks is then shifted to further correct the duty-cycle. This means that, for both slow PVT and fast PVT, the duty-cycle can be corrected to 50%.

The circuits shown in FIG. 4 and FIG. 5 illustrate how to determine when 50% duty cycle is achieved. FIG. 4 illustrates a duty-cycle correction system 400, comprising a duty-cycle correction circuit 420, which receives an input clock CLK_IN and generates an output clock CLK_OUT to a detector 430, comprising a duty-cycle detection circuit 440 and a digital finite state machine 460. The duty cycle correction circuit 420 may be the duty cycle correction circuit 200 illustrated in FIG. 2. As in the duty cycle correction circuit 200, the output clock CLK_OUT is a clock signal which has had its rising-edge shifted by an amount X determined according to the MDLL code m for that particular wafer, and has had its falling-edge shifted by an amount in a range between 0 and NX, wherein N is an integer preferably equal to 2. Initially, the falling-edge delay is based on a worst guess estimation of how the duty cycle varies from an ideal duty cycle of 50%. After shifting the rising edge and falling edge based on X, the detector 430 generates a comparison signal based on the duty cycle of the output clock CLK_OUT. The comparison signal is fed back to the duty cycle correction circuit 420 and used to fine-tune the amount by which the falling-edge should be shifted in order to achieve a 50% duty cycle. For example, the comparison is performed by using a reference voltage VREF input to the duty cycle detection circuit 440 and generating an output according to a comparison between VREF and the output clock CLK_OUT. This output is sent to the digital finite-state machine 460, which generates the feedback signal to the duty-cycle correction circuit 420, indicating an amount by which the falling-edge should be further shifted. Specifically, this signal is input to the variable fall delay circuit (e.g. variable fall delay circuit 230 illustrated in FIG. 2), which adjusts the variable fall delay within the range 0~NX in order to change/fine-tune the falling-edge delay, by turning on a combination of coarse and fine delay elements.

FIG. 5 further illustrates the operation and circuitry of the duty-cycle detection circuit 440. As shown in the diagram, the duty-cycle detection circuit 440 comprises a potential divider, consisting of multiple resistors coupled between a power source VDD and ground. Please note that FIG. 5 shows three resistors, but this is merely for illustrative purposes and is not a limitation of the present invention. The output of the potential divider is the reference voltage VREF and is input to a negative differential input of a comparator 443. The positive differential input of the comparator is coupled to an RC filter, which receives the output clock CLK_OUT. The comparator compares the output of the RC filter (which will be equal to a percentage of the duty-cycle*VDD) with the reference voltage (which will be set to be 50% of VDD). For example, if the initial duty-cycle of CLK_OUT is 42%, the output of the RC filter will be 0.42*VDD. VREF is set to be 0.5*VDD. The comparator will therefore output a '0' indicating that the 50% duty-cycle is not reached. The rising-edge delay is fixed, so this output is only for tuning the falling-edge delay (in the range from 0~NX as detailed above). When said output meets the 50% duty-cycle correction, i.e. the output of the RC filter is equal to or greater than 0.5*VDD, the comparator will output a '1', indicating the falling-edge shifting can stop.

FIG. 8 is an illustration of delay elements within a delay circuit 800; for example, the fixed delay circuit 270 and the variable fall delay circuit 230. FIG. 8 shows coarse delay elements 811, 821 and 881. FIG. 8 also shows a fine delay element 813. Each delay element comprises a coarse delay element and a fine delay element; the diagram only shows three coarse delay elements and a single fine delay element for brevity. In addition, fine delay element 813 is illustrated as a generic fine delay element which may comprise a delay element with any of the coarse delay elements illustrated. Coarse delay element 811 receives an initial signal "1", a first enable signal EN1, a second enable signal EN2, and an input signal IN. Coarse delay element 811 generates an output signal OUT1 which is input to the next coarse delay element 821, which also receives enable signals EN3, EN4, and the input signal IN. Fine delay element 813 receives an output signal OUTN from the coarse delay element with which it forms a delay element, and also receives an output signal OUT(N−1) from a previous coarse delay element, as well as a selection signal SEL<7:0>.

Figure 9A:
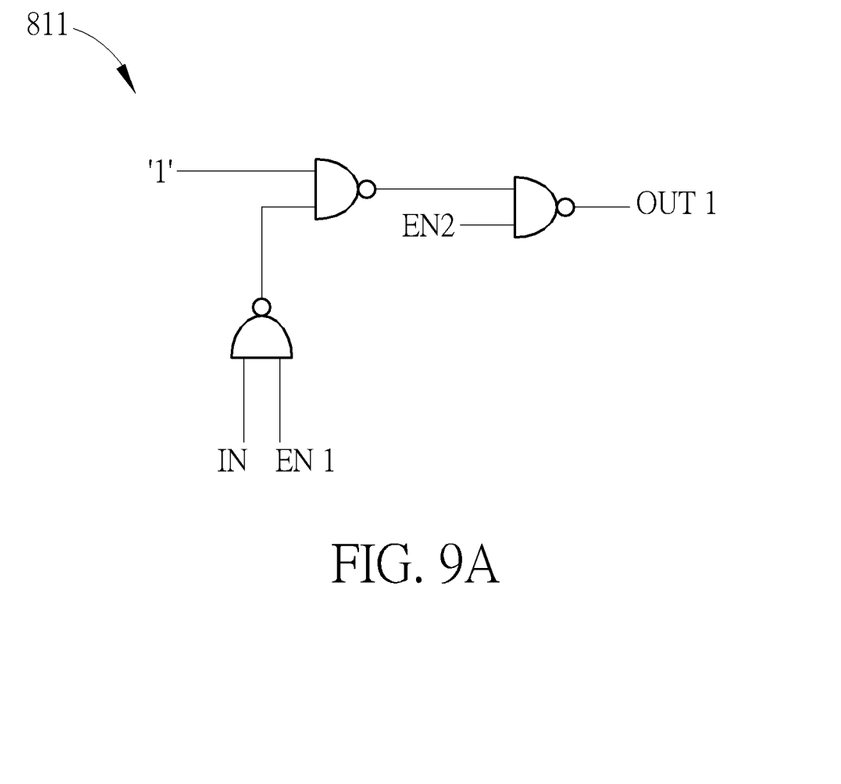
FIG. 9A is a diagram of a coarse delay element illustrated in FIG. 8.

FIG. 9A illustrates the internal structure of the coarse delay element 811 shown in FIG. 8. As shown in the diagram, coarse delay element 811 comprises three NAND gates coupled in series, wherein: the first NAND gate receives the input signal IN and the first enable signal EN1; the second NAND gate receives the output from the first NAND gate and the initial signal '1'; and the third NAND gate receives the output from the second NAND gate and the second enable signal EN2, and generates the output OUT1.

Figure 9B:
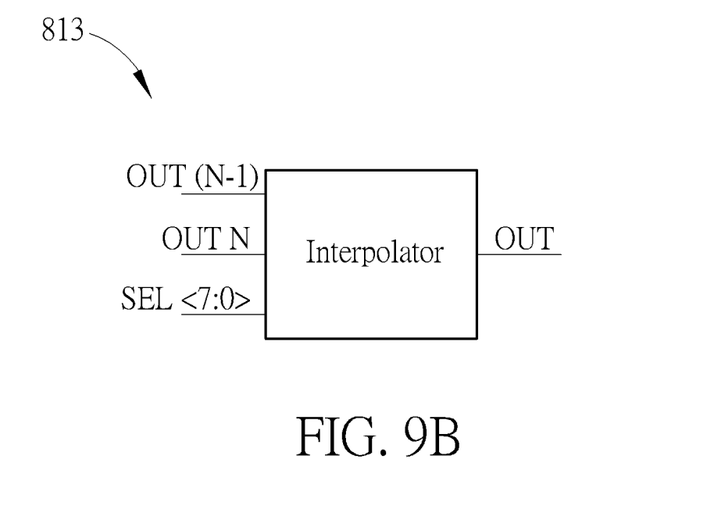
FIG. 9B is a diagram of a fine delay element illustrated in FIG. 8.

FIG. 9B illustrates the internal structure of the fine delay element 813 shown in FIG. 8. As shown in the diagram, fine delay element 813 is an interpolator which interpolates between the input signals OUT(N−1) and OUTN (i.e. the input and output signals of a coarse delay element within the same delay element as fine delay element 813) according to the selection signal SEL<7:0> to give a fine delay step.

Figure 6:
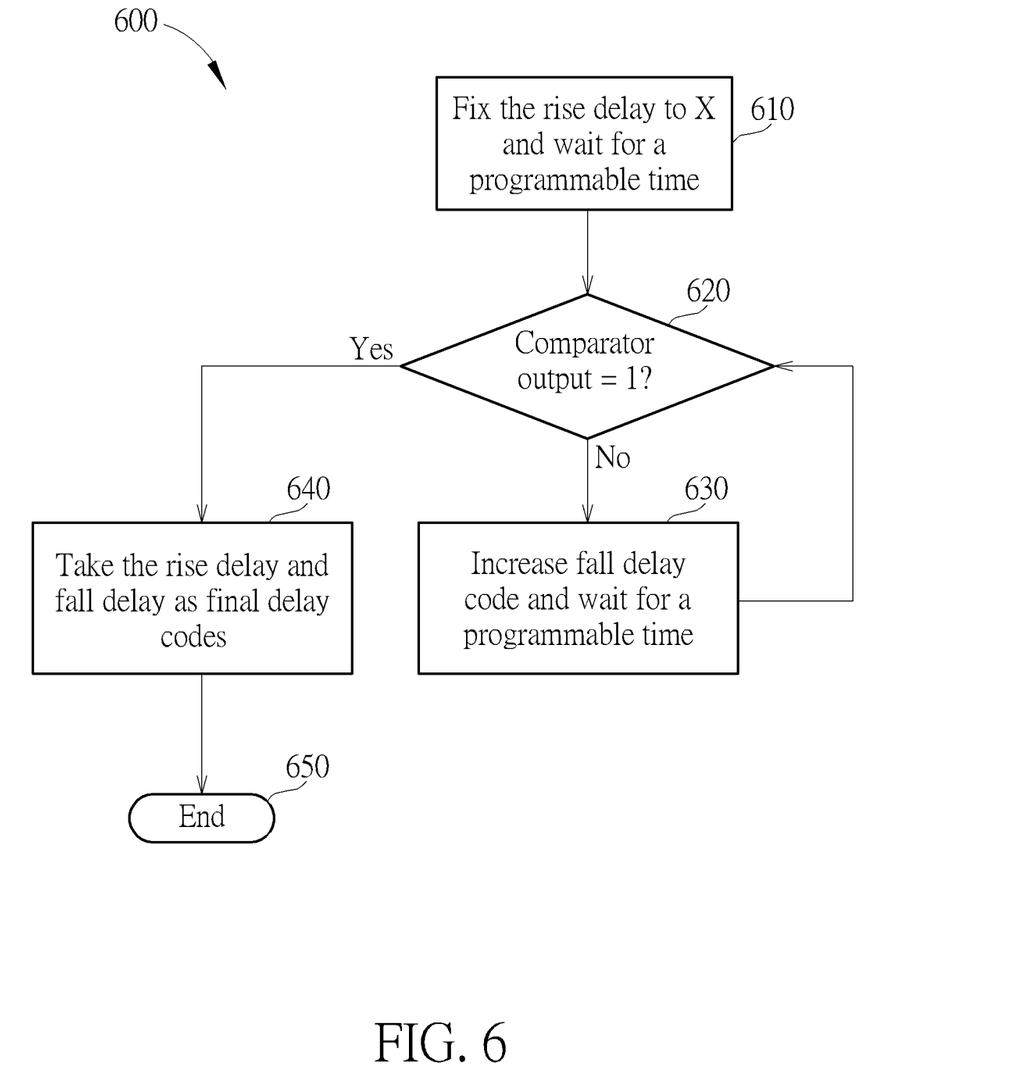
FIG. 6 is a flowchart of a method according to an exemplary embodiment of the present invention.

Refer to FIG. 6, which is a flowchart 600 of the duty-cycle correction method of the present invention. In Step 610, the rising edge delay is fixed to 'X', wherein X is the percentage of the Master DLL code. As illustrated in FIG. 4 and FIG. 5, the rising-edge of the clock will be shifted by X, and the method waits for a programmable time. In Step 620, it is determined whether the comparator output equals one. When this is true, the flow proceeds to Step 640, and the rising edge delay (X) and falling edge delay (0~NX) are taken as the final delay codes. The flow ends (Step 650). If the comparator output is not '1', the flow proceeds to Step 630, wherein the falling edge delay code is altered (for example, by adding or removing coarse delay elements or fine-delay elements), and the method waits for a programmable time. The flow returns to Step 620.

Figure 7:
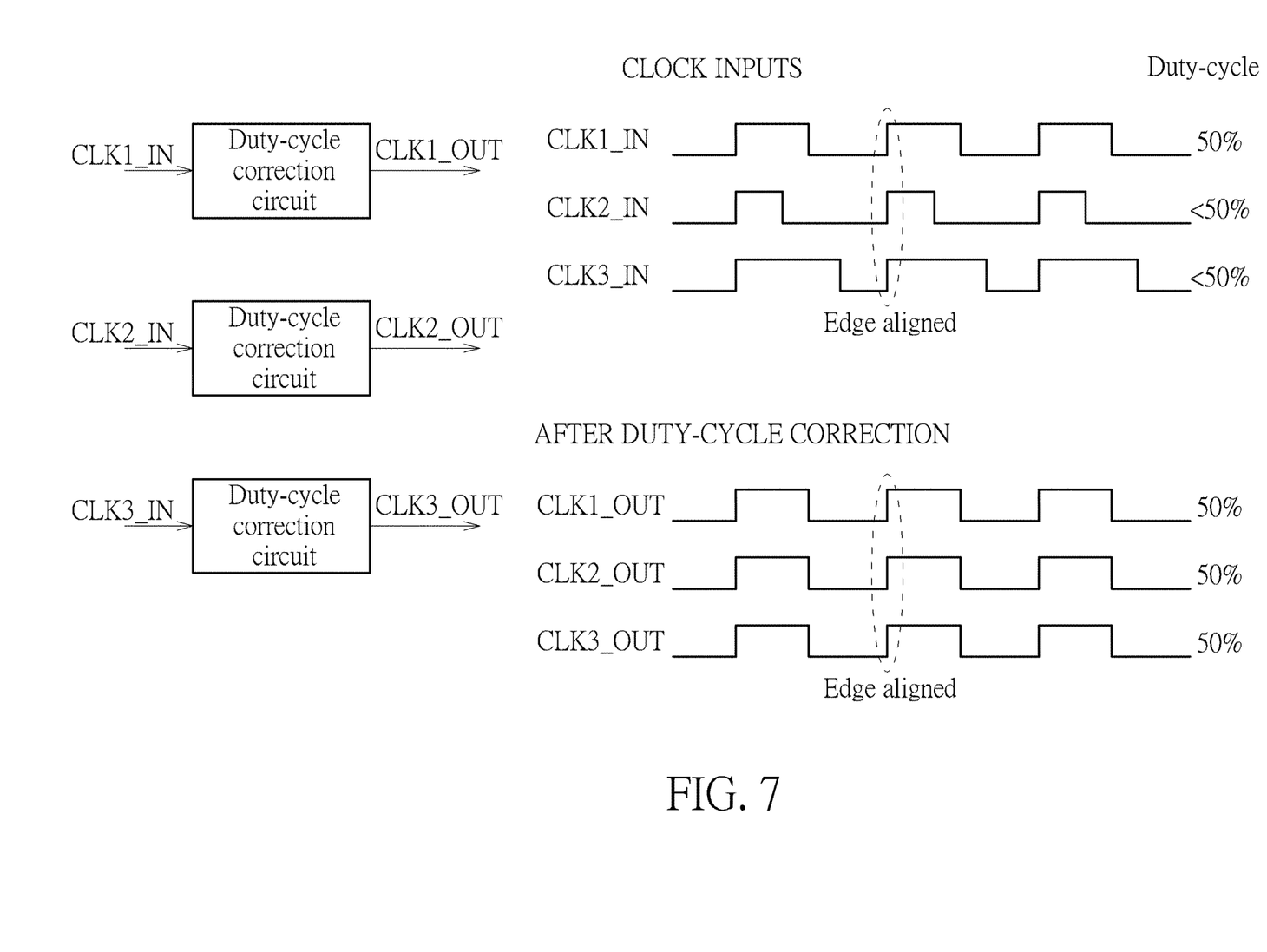
FIG. 7 is a diagram of inputs and outputs of multiple clocks after duty-cycle correction of the present invention.

FIG. 7 illustrates how the input clock and output clock duty-cycles are aligned and synchronized. As shown in the top right-hand diagram, the three input clocks all have different duty-cycles, although their rising edges are aligned. After duty-cycle correction, all output clocks have rising edges which are aligned, and the duty-cycle of each is achieved at 50%.

It will be understood that the use of coarse delay elements and fine-delay elements for shifting the rising edge and falling edge of the clock signals may be achieved by many circuits. The method and system of the present invention can reduce jitter in output signals as only the necessary number of fixed delay stages need to be utilized, and these can provide duty-cycle correction across PVT variations. Power can also be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing duty-cycle correction of an output clock in a Double Data Rate (DDR) system, the method comprising:
    setting a fixed delay of a rising-edge of the output clock as a parameter X which is equal to a digital Master Delay Locked Loop (MDLL) code of the DDR system multiplied by a percentage representing an estimated distortion of the duty-cycle of the output clock from a desired duty-cycle;
    shifting the rising-edge of the output clock by the fixed delay; and
    determining whether a duty cycle of the output clock meets the desired duty-cycle;
    wherein when the duty-cycle of the output clock meets the desired duty-cycle, taking the fixed rising-edge delay as a final delay code for the output clock, and when the duty-cycle of the output clock does not meet the desired duty-cycle, shifting a falling-edge of the output clock by an amount in a range between 0 and NX, wherein N is an integer.

2. The method of claim 1, further comprising:
    determining whether the duty cycle of the output clock meets the desired duty cycle;
    wherein when the duty-cycle of the output clock meets the desired duty-cycle, taking the fixed rising-edge delay and the falling-edge delay as final delay codes for the output clock, and when the duty-cycle of the output clock does not meet the desired duty-cycle, changing an amount by which the falling-edge of the output clock is shifted, wherein the amount is within the range between 0 and NX.

3. The method of claim 2 wherein N is equal to two.

4. A duty-cycle correction system for an output clock in a Double Data Rate (DDR) system, the duty-cycle correction system comprising:

a duty-cycle correction circuit, for receiving an input clock and generating the output clock having a rising-edge shifted by a fixed delay X which is equal to a Master Delay Locked Loop (MDLL) code of the DDR system multiplied by a percentage representing an estimated distortion of the duty-cycle of the output clock from a desired duty-cycle; and a detector coupled to the duty-cycle correction circuit for generating a comparison signal based on the duty-cycle of the output clock;

wherein when the comparison signal indicates the duty-cycle of the output clock meets the desired duty-cycle, the fixed rising-edge delay is taken as a final delay code for the output clock, and when the comparison signal indicates the duty-cycle of the output clock does not meet the desired duty-cycle, the duty-cycle correction circuit shifts a falling-edge of the input clock by an amount in a range between zero and NX, wherein N is an integer.

5. The duty-cycle correction system of claim 4, wherein the duty cycle correction circuit comprises:

a variable delay circuit comprising a plurality of delay elements for receiving the input clock and shifting the falling-edge of the input clock by the amount in the range between zero and NX, and coupled to a first output path and a second output path;

a fixed delay circuit comprising a series of delay elements for receiving the input clock and shifting the rising-edge of the input clock by the amount X, and coupled to a third output path and a fourth output path;

a series of cascode transistors coupled between a power supply and ground, and comprising a first PMOS coupled to the first output path, a second PMOS coupled to the second output path, a first NMOS coupled to the third output path, and a second NMOS coupled to the fourth output path;

a first plurality of inverters on the second output path coupled between the variable delay circuit and the second PMOS;

a second plurality of inverters on the fourth output path coupled between the fixed delay circuit and the second NMOS; and an inverter, coupled between the first PMOS and the first NMOS, for generating the output clock.

6. The duty-cycle correction system of claim 5, wherein each delay element in the series of delay elements comprises a coarse delay element and a fine delay element, and the coarse delay elements and fine delay elements are selectively enabled according to the value of X.

7. The duty-cycle correction system of claim 4, wherein the detector comprises a duty-cycle detection circuit, comprising:

a potential divider, for generating a reference voltage;

an RC filter for receiving the output clock from the duty-cycle correction circuit and generating an output voltage representing the duty-cycle of the output clock as a percentage of a total power supply; and a comparator, for receiving the reference voltage and the output voltage and generating the comparison signal;

wherein when the reference voltage is less than the output voltage, the comparison signal indicates the duty-cycle of the output clock is less than the desired duty-cycle, and when the reference voltage is equal to or greater than the output voltage, the comparison signal indicates the duty-cycle of the output clock is more than the desired duty-cycle, and the duty-cycle correction circuit shifts the falling edge until the reference voltage is more than the output voltage.

8. The duty-cycle correction system of claim 7, wherein the detector further comprises:

a digital finite state machine coupled to the duty-cycle detection circuit, for receiving the comparison signal and generating an output which is fed back to the duty cycle correction circuit, to change an amount by which the falling-edge of the output clock is shifted, wherein the amount is within the range between 0 and NX.

9. The duty-cycle correction system of claim 4, wherein N is equal to two.

* * * * *